(12) United States Patent
Funayama et al.

(10) Patent No.: US 6,724,582 B2
(45) Date of Patent: Apr. 20, 2004

(54) CURRENT PERPENDICULAR TO PLANE TYPE MAGNETORESISTIVE DEVICE, MAGNETIC HEAD, AND MAGNETIC RECORDING/REPRODUCING APPARATUS

(75) Inventors: Tomomi Funayama, Fujisawa (JP); Masayuki Takagishi, Kawasaki (JP); Masatoshi Yoshikawa, Yokohama (JP); Kohichi Tateyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 10/050,543

(22) Filed: Jan. 18, 2002

(65) Prior Publication Data
US 2002/0097533 A1 Jul. 25, 2002

(30) Foreign Application Priority Data

Jan. 19, 2001 (JP) .............................. 2001-012122
Sep. 17, 2001 (JP) .............................. 2001-282276
Dec. 27, 2001 (JP) .............................. 2001-398384

(51) Int. Cl.⁷ ................................................. G11B 5/39
(52) U.S. Cl. ...................................................... 360/324.1
(58) Field of Search ........................ 360/324.1, 324.11, 360/324.12, 324.2, 324, 322

(56) References Cited

U.S. PATENT DOCUMENTS 5,668,688 A    9/1997  Dykes et al.
5,898,547 A  * 4/1999  Fontana et al. .......... 360/324.2
6,198,609 B1 * 3/2001  Barr et al. ................. 360/322
6,504,690 B2 * 1/2003  Komuro et al. .......... 360/324.2
6,519,124 B1 * 2/2003  Redon et al. ............. 360/324.2

FOREIGN PATENT DOCUMENTS

JP          10-55512        2/1998

OTHER PUBLICATIONS

K. Nagasaka, et al., Journal of Applied Physics, vol. 89, No. 11, pp. 6943–6945, "Giant Magnetoresistance Properties of Specular Spin Valve Films in a Current Perpendicular to Plane Structure", Jun. 1, 2001.

* cited by examiner

Primary Examiner—David L. Ometz
(74) Attorney, Agent, or Firm—Oblon, Spivak, McClelland, Maier & Neustadt, P.C.

(57) ABSTRACT

A current perpendicular to plane type magnetoresistive device has a magnetoresistive film, a pair of electrodes which allow a sense current to flow through the magnetoresistive film in a perpendicular direction to the plane thereof, and a biasing film which imparts a biasing magnetic field to the magnetoresistive film in a parallel direction to film plane. The direction of the magnetic field generated by the sense current flowing through the magnetoresistive film in the perpendicular direction to film plane is made substantially anti-parallel to the direction of the biasing magnetic field in a vicinity of a portion of the magnetoresistive film where a signal magnetic flux is introduced.

20 Claims, 10 Drawing Sheets

CURRENT PERPENDICULAR TO PLANE TYPE MAGNETORESISTIVE DEVICE, MAGNETIC HEAD, AND MAGNETIC RECORDING/REPRODUCING APPARATUS

CROSS-REFERENCE TO RELATED APPLICATIONS

This application is based upon and claims the benefit of priority from the prior Japanese Patent Applications No. 2001-12122, filed Jan. 19, 2001; No. 2001-282276, filed Sep. 17, 2001; and No. 2001-398384, filed Dec. 27, 2001, the entire contents of all of which are incorporated herein by reference.

BACKGROUND OF THE INVENTION

1. Field of the Invention

The present invention relates to a current perpendicular to plane type magnetoresistive device, a magnetic head including the current perpendicular to plane type magnetoresistive device, and a magnetic recording/reproducing apparatus employing the magnetic head.

2. Description of the Related Art

In recent years, magnetic recording apparatuses such as a hard disk drive and so on have been made more compact and more highly dense rapidly, and it is forecasted that they will be made further more highly dense. In order to attain high density in magnetic recording, it is required to increase recording track density by narrowing a recording track width, and also to increase longitudinal recording density, i.e., linear recording density.

However, in in-plane longitudinal recording, the higher the recording density, the larger the diamagnetic field, and therefore reproduction output is decreased and stable recording cannot be made, which has been problems for the prior art. To solve these problems, perpendicular recording is proposed. In the perpendicular recording, a recording medium is magnetized in a perpendicular direction to its plane and thereby recording is carried out. The perpendicular recording is subjected to less influence of diamagnetic field even when recording density is increased compared with the longitudinal recording, which makes it possible to prevent reproduction output from deteriorating.

Conventionally, in both longitudinal recording and perpendicular recording, an inductive head has been employed for reproducing medium signals. However, when the recording track width is narrowed along with high density and the recorded magnetization becomes small, it is difficult to obtain sufficient reproduction signal output with the inductive head. Therefore, so as to attain sufficient reproduction signal output even when the recorded magnetization becomes small, an anisotropic megnetoresistive (AMR) head with high reproduction sensitivity employing an anisotropic megnetoresistance effect has been developed, and used as a shield type reproducing head. In recent years, a spin valve type giant magnetoresistive (GMR) head with higher sensitivity employing a giant magnetoresistance effect has come to be used.

Further, research and development toward practical applications of magnetic heads using tunneling magnetoresistive (TMR) device and current perpendicular to plane (CPP)-GMR device with expectations of still higher reproduction sensitivity are promoted. In these devices, a sense current is flowed in a perpendicular direction to film plane thereof. The CPP-GMR devices are disclosed in, for example, Jpn. Pat. Appln. KOKAI Publication No. 10-55512 and U.S. Pat. No. 5,668,688. In this way, magnetic heads with high reproduction sensitivity have been developed, and, by using them, it has become possible to reproduce recorded signals even when recording bit size becomes extremely small.

So as to increase linear recording density in a recording track, it is necessary to narrow a gap of a magnetic head. In a conventional magnetic head using magnetoresistance effect, a magnetoresistive device is formed in a head gap defined by the space between a pair of shields. In both AMR head and spin valve GMR head, the thickness of a magnetoresistive device must be about 30 nm, and, taking into consideration of insulation with shields, the space between shields must be about 100 nm. In this way, the range where the head gap can be narrowed is limited to about 100 nm for the conventional magnetic head, which has been a large obstacle in increasing linear recording density. In order to realize a narrow gap under these circumstances, proposed is a device having a structure that a flux guide is formed on the air-bearing surface side and a sensing portion is recessed from the air-bearing surface. Especially, in a CPP-GMR device, it is required to arrange a GMR device and a pair of upper and lower electrodes between shields, and the thickness of these members becomes a great restriction to the narrow gap. Accordingly, in order to attain narrow gap in a CPP-GMR device, it is effective to form a flux guide on the air-bearing surface side and recess the electrodes from the air-bearing surface, thereby disposing a thin flux guide only between shields on the air-bearing surface.

So as to suppress Barkhausen noise in a magnetoresistive film, it is effective to arrange biasing films on both sides of the magnetoresistive film and apply a biasing magnetic field. However, the present inventors have found that when the distance between biasing films is narrowed along with narrow track for improving recording density, the biasing magnetic field is applied to the magnetoresistive film too strongly, as a result magnetization reversal becomes hard, which brings about a problem of deteriorating the device sensitivity.

In the conventional current in plane (CIP)-GMR device in which a sense current is flowed through the film plane, an operating point are determined by balancing three magnetic fields, namely, a current magnetic field generated by a sense current, a magnetostatic coupling magnetic field from a pinned layer to a free layer, and an interlayer coupling magnetic field between a pinned layer and a free layer. However, in a device in which a sense current is made to flow in a perpendicular direction to the film plane thereof, since the sense current magnetic field is applied in a circular form around the center of the current, it is impossible to use the designing scheme for determining the operation point mentioned above. Further, since the sense current magnetic field acts most strongly at the edge portions of the electrodes for supplying the sense current, the medium flux is disturbed to be introduced into the magnetoresistive film under the electrodes as a sensing area, which leads to declined sensitivity of the sensor.

These problems have not been pointed out in the above-mentioned Jpn. Pat. Appln. KOKAI Publication No. 10-55512 and U.S. Pat. No. 5,668,688, and therefore these documents do not suggest a solution to the problems.

To solve the above problem that sensitivity of the device is deteriorated when the distance between the biasing films is narrowed, the distance between the biasing films may be made apart in some measure so that the distance between the electrode and the biasing films may be made apart. However, in a CPP-GMR device, there is also found a problem that when a physical track width defined by the electrode width becomes smaller than about 0.3 μm, the effective track width becomes wider than the physical track width. This phenomenon is made more significant in structures where the distance between the electrode and the biasing films is long. As one of causes of this problem, it is considered that the medium flux is introduced into the magnetoresistive film located between the electrode and the biasing films. From these causes, it is difficult to attain a desired effective track width, and to cope with a narrow track width.

The abovementioned problem that the current magnetic field prevents introduction of the medium flux becomes more significant when the recording density becomes higher, namely when the size of the magnetoresistive device as a sensor and the electrode becomes smaller. For example, when the electrode size is made smaller than 1 μm×1 μm to implement a recording density exceeding 100 Gbpsi, the medium flux is prevented from being introduced into the magnetoresistive film under the electrode. When the electrode size is made small, in particular, since it is necessary to flow a high sense current so as to obtain a certain level of output, the problem mentioned above becomes serious.

As practical examples, four types of CPP-GMR devices each having following (electrode size, GMR film size) were fabricated, respectively: (0.5 μm×0.5 μm, 1.2 μm×1.2 μm), (0.3 μm×0.3 μm, 0.7 μm×0.7 μm), (0.2 μm×0.2 μm, 0.5 μm×0.5 μm), and (0.1 μm×0.1 μm, 0.3 μm×0.3 μm). A sense current of 5 mA was applied to each CPP-GMR device, and the flux density distribution in the GMR film was examined under the state that the sense current magnetic field is applied. As a result, in the CPP-GMR device having (electrode size, GMR film size) of (0.5 μm×0.5 μm, 1.2 μm×1.2 μm), the flux density in the GMR film was sufficiently small. As the electrode size became smaller, however, it was found that the flux density in the GMR film became significantly strong on the edge portions of the electrode compared with other portions. FIG. 1 shows a relationship between the electrode size and the maximum flux density in the GMR film on the edge portions of the electrode. FIG. 2 shows a relationship between the sense current and the maximum flux density in the GMR film on the edge portions of the electrode of the CPP-GMR device having (electrode size, GMR film size) of(0.1 μm×0.1 m, 0.3 μm×0.3 μm).

Considering all the various results together, in the case where the electrode size is 0.3 μm×0.3 μm or less and the sense current value is 1 mA or more, and particularly in the case where the electrode size is 0.1 μm×0.1 μm or less and the sense current value is 3 mA or more, it is required to take countermeasures so that introduction of the medium flux into the GMR film under the electrode should not be prevented so as to increase the sensitivity of the sensor.

In magnetic recording apparatuses such as a hard disk drive and the like, as high recording density progresses, a flying height that is a distance between the magnetic head and the recording medium is gradually lowered. Such decrease in flying height means that there is an increasing possibility of head crash with minute protrusions on the recording medium, and thermal asperity (TA) noise becomes an actual problem. Therefore, it is preferable to adopt a yoke type head configuration in which the medium flux is introduced into the magnetoresistive device via the yoke so that the magnetoresistive device should not be exposed to the air-bearing surface. Among yoke type magnetic heads, a horizontal yoke type magnetic head, in which the magnetoresistive device is arranged with its film surface in parallel with the air-bearing surface, is advantageous because the structure enables to arrange the whole magnetoresistive device near to the medium. Even in such a yoke type magnetic head, there is a problem that the sensor sensitivity is decreased when a strong biasing magnetic field is applied or a strong sense current magnetic field is applied. Accordingly, it is preferable to increase the sensitivity of the sensor.

BRIEF SUMMARY OF THE INVENTION

Accordingly, an object of the present invention is to provide a current perpendicular to plane type magnetoresistive device that enables to decrease influences of a current magnetic field and a biasing magnetic field, thereby improving sensitivity, a magnetic head including the current perpendicular to plane type magnetoresistive device, and a magnetic recording/reproducing apparatus employing the magnetic head.

A current perpendicular to plane type magnetoresistive device according to one aspect of the present invention comprises: a magnetoresistive film; a pair of electrodes which allow a sense current to flow through the magnetoresistive film in a perpendicular direction to film plane; and a biasing film which imparts a biasing magnetic field to the magnetoresistive film in a parallel direction to film plane; wherein the direction of the magnetic field generated by the sense current flowing through the magnetoresistive film in the perpendicular direction to film plane is made substantially anti-parallel to the direction of the biasing magnetic field in a vicinity of a portion of the magnetoresistive film where a signal magnetic flux is introduced.

A current perpendicular to plane type magnetoresistive device according to another aspect of the present invention comprises: a magnetoresistive film; a pair of electrodes which allow a sense current to flow through the magnetoresistive film in a perpendicular direction to film plane; a biasing film which imparts a biasing magnetic field to the magnetoresistive film in a parallel direction to film plane; and a magnetic film disposed in a vicinity of a portion of the magnetoresistive film where a signal magnetic flux is introduced to the magnetic film; wherein the direction of the magnetic field generated by the sense current flowing through the magnetoresistive film in the perpendicular direction to film plane is made substantially anti-parallel to the direction of the biasing magnetic field in the magnetic film.

The magnetic film disposed on the side of the magnetoresistive film where a signal flux is introduced functions as a flux guide that guides the signal flux into the magnetoresistive film. This magnetic layer may be the whole magnetoresistive film, or a magnetic layer formed by extending only a free layer of the magnetoresistive film to the air-bearing surface side, or a soft magnetic layer of NiFe or the like arranged separately from the magnetoresistive film.

DETAILED DESCRIPTION OF THE INVENTION

Figure 1:
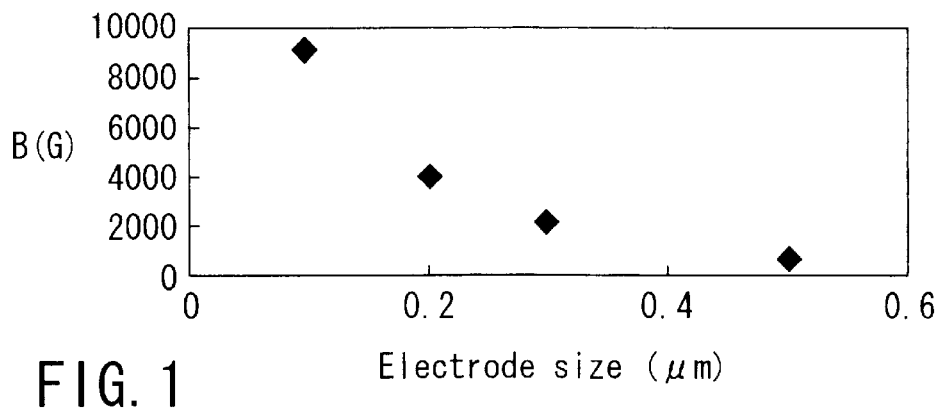
FIG. 1 is a diagram showing a relationship between an electrode size and a maximum flux density in a magnetoresistive film on edge portions of an electrode.
Figure 2:
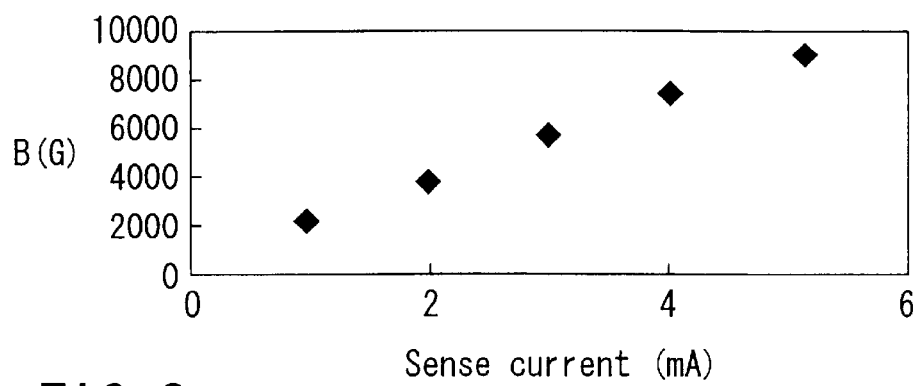
FIG. 2 is a diagram showing a relationship between a magnitude of a sense current and a maximum flux density in a magnetoresistive device on edge portions of an electrode.

Materials of films and film structures included in a current perpendicular to plane type magnetoresistive device according to an embodiment of the present invention will be explained hereinafter.

A magnetoresistive film may be a TMR film or a CPP-GMR film. A GMR film included in the CPP-GMR film, for example, may have a structure in which a conductive nonmagnetic intermediate layer is sandwiched between two ferromagnetic layers. In this structure, one of the ferromagnetic layers functions as a magnetization pinned layer (pinned layer) whose magnetization is pinned by laminating antiferromagnetic layers, while the other functions as a magnetization free layer (free layer) whose magnetization rotates freely by an external magnetic field. Besides these layers, an underlayer, a protective layer and the like may be formed.

As a biasing film, a hard magnetic film such as CoPt and the like, or an antiferromagnetic film such as PtMn, IrMn and the like may be employed. A pair of biasing films is arranged on both sides of a magnetoresistive film so that a biasing magnetic field is applied in a predetermined direction along the plane of the magnetoresistive film. The biasing film may be arranged adjacent to both sides of the magnetoresistive film, or arranged above or below the both sides of the magnetoresistive film, or arranged by overlapping on a part of the both sides of the magnetoresistive film. It is preferable to select these arrangement methods in combination according to magnetic characteristics and film thickness of the biasing film so that the optimized biasing magnetic field should be applied to the magnetoresistive film.

A pair of electrodes is arranged above and under the magnetoresistive film so that a current should flow in a substantially perpendicular direction to the plane of the magnetoresistive film. The electrode may be formed by conductive film such as Cu and the like. The electrode may be formed of other portion than the free layer of the magnetoresistive film, for example a part of the protective film, antiferromagnetic film, and pinned layer. It is preferable that these electrodes are arranged at the central portion of the magnetoresistive film, being apart from the biasing films arranged on both ends of the magnetoresistive film, and being recessed from the air-bearing surface. When the electrodes are arranged as mentioned above, the magnetoresistive film located between the electrode and the air-bearing surface functions as a flux guide. As mentioned above, the flux guide may be a part of the free layer extended toward the air-bearing surface, or a soft magnetic layer arranged separately from the magnetoresistive film. The electrodes arranged above and below the magnetoresistive film form a pillar shape, and they allow a sense current to flow through only a high sensitivity area of the magnetoresistive film, avoiding an area adjacent to the biasing film whose sensitivity is made lower under the influence of the strong biasing magnetic field. Therefore, in the case where a GMR film is employed as the magnetoresistive film, it is advantageous for optimizing current distribution in the film. Since it is difficult to form electrodes of substantially identical size above and below the magnetoresistive film without displacement, it is preferable to make one of electrodes wider than the other so as to lessen the influence of displacement error.

In the case where a magnetic film as the flux guide is formed in addition to the magnetoresistive film, it is preferable for the magnetic film to be formed in contact with the free layer in the magnetoresistive film, although not restricted to the structure as long as the magnetic film can introduce the medium flux to the free layer. For example, the magnetic film needs not be in contact with the free layer. Alternatively, a thin contact layer made of a nonmagnetic material may be formed between the free layer and the magnetic layer.

Also, it is preferable for the magnetic film as the flux guide to be formed in contact with the biasing films, although not restricted to the structure as long as the biasing films can apply a biasing magnetic field sufficient to stabilize a magnetization in the end portions of the magnetic film. For example, the magnetic film needs not be in contact with the biasing films. Alternatively, thin contact layers made of a nonmagnetic material may be formed between the free layer and the biasing films.

It is preferable to arrange the biasing films on both sides of the magnetoresistive film including the flux guide. In this case, the end of the flux guide on the air-bearing surface side may be formed so as to be in the same plane with the end of the biasing films on the air-bearing surface side. Alternatively, a part of the end of the flux guide on the air-bearing surface side may be formed so as to protrude toward the medium from the end of the biasing film on the air-bearing surface side.

In a current perpendicular to plane type magnetoresistive device according to the embodiment, supposing that a width of a contact area between the magnetoresistive film and the electrode (the narrower one of a pair of electrodes) in a track width direction is L1, a distance between an end of the electrode and an end of the biasing film facing to each other is L2, and a distance between an end of the flux guide (a part of the magnetoresistive film or the other magnetic film) on the air-bearing surface side and an end of the electrode substantially parallel therewith is L3, it is preferable to meet the following relationship:

$$L1 \times 0.2 < L2 < L1 \times L2, \text{ and } 0 < L3 - 0.1 \text{ }\mu m.$$

This design enables to increase sensitivity and at the same time to prevent an effective track width from being made wide.

The above width L1 of a contact area between the magnetoresistive film and the electrode in the track width direction is the designed width of the electrode in the track width direction, more concretely, it means the width in the track width direction of the area where the electrode is in electrically contact with the magnetoresistive film. A current flows from the electrode to the magnetoresistive film, or from the magnetoresistive film to the electrode through the contact area. The reason why the width L1 of the contact area is strictly defined is because the actually processed electrode width may be different from the designed electrode width, for example, the processed electrode width may become narrower than the designed width.

The reason why the relationship of the distance L2 between the electrode and the biasing film to the electrode width L1 is as follows. Namely, when the distance L2 is too short, the biasing magnetic field acts strongly on the magnetoresistive film under the electrode, leading to deteriorated sensitivity. On the other hand, when the distance L2 is too long, the biasing magnetic field becomes weak, which brings about occurrence of domains that may cause Buarkhausen noise in the free layer of the GMR film as well as significant increase in the effective track width owing to the medium flux introduced into side portions around the electrode. On the contrary, if the condition of L2<L1×2 is met, magnetization of the GMR film in the vicinity of the biasing film is hard to rotate, and the medium flux intruding into side portions around the electrode is lowered, which makes it possible to prevent the effective track width from increasing. Therefore, it is preferable that the condition of L1×0.2<L2<L1×2 is satisfied, and it is more preferable that the condition of L1×0.5<L2<L1×1 is satisfied.

In the conventional magnetoresistive device, if the electrode width is reduced and the space between the biasing films is reduced for realizing a narrow track width, it has become difficult to improve sensitivity because of various reasons, as described above. On the contrary, the magnetoresistive device of is the present embodiment that satisfies the above requirements can realize great improvement in sensitivity compared with the conventional one even when the width of the electrode (electrode of the narrower width, more specifically the contact area between the electrode and the magnetoresistive film) is 0.3 $\mu$m or less, and further the space between the biasing films is 0.3 $\mu$m or less.

The current perpendicular to plane type magnetoresistive device according to the present embodiment may be used in a shield type magnetic head in combination with a pair of magnetic shields formed so as to sandwich the magnetoresistive device. In this case, if the shield type magnetic head is fabricated into a structure that the electrode is recessed from the air-bearing surface and only the flux guide (a part of the magnetoresistive film, soft magnetic film forming the magnetic free layer of the magnetoresistive film, or other soft magnetic film) is sandwiched by a pair of shields at the air-bearing surface, it is possible to realize a narrow gap, as mentioned previously. This structure is also highly resistant to thermal asperity and the like. The distance L3 between an end of the electrode and the air-bearing surface in this structure is made larger than zero so that the electrode should not be exposed to the air-bearing surface. However, if the distance L3 is too large, not only a signal flux cannot be transmitted effectively to the magnetoresistive film between the electrodes, but also an amount of a medium flux intruding into the magnetoresistive film on both sides of the electrode is easily increased with the result that an effective track width is increased. Therefore it is preferable that the condition of 0<L3<0.1 $\mu$m is satisfied. In this way, the current perpendicular to plane type magnetoresistive device according to the present embodiment is effectively employed for a shield type magnetic head and the like.

In the current perpendicular to plane type magnetoresistive device according to the present embodiment, at a side where a signal flux is introduced into the sensing area, the direction of a magnetic field of the biasing film and the direction of a magnetic field generated by a current flowing through the magnetoresistive film in a perpendicular direction to the plane thereof are substantially anti-parallel with each other, and therefore these magnetic fields work to compensate with each other. As a consequence, it is possible to increase permeability in the side of the magnetoresistive film where the signal flux is introduced, so that it is possible to obtain an optimum operational point of the magnetoresistive film and to improve sensitivity. Note that, it is not always necessary that the biasing magnetic field and the sense current magnetic field be cancelled out with each other. Alternatively, if a weak biasing magnetic field is applied to the side where a signal flux is introduced so as to attain a single domain, it is possible to suppress Barkhausen noise. As mentioned above, when the sense current magnetic field and the biasing magnetic field are made substantially anti-parallel with each other on the air-bearing surface side and respective magnetic fields are set appropriately, it is possible to attain improvement in output and control of Barkhausen noise at the same time.

When an end of the flux guide on the air-bearing surface side and an end of the biasing film on the air-bearing surface side are formed be in the same plane, advantages that the biasing magnetic field becomes stable in the flux guide and manufacturing process is made simple can be provided.

The present embodiment is especially effective when the electrode is made small and the sense current value is made high so as to realize high recording density. More concretely, the present embodiment provides remarkable effects in the case where the electrode size is 0.3 μm×0.3 μm or less and the sense current value is 1 mA or more, especially where the electrode size is 0.1 μm×0.1 μm or less and the sense current value is 3 mA or more.

It is preferable to set a sense current I in a range of 0<I<20 mA, supposing that the direction of the current is defined as the plus direction in the case where the current is flowed so that a magnetic field is generated that is substantially anti-parallel to the direction of the biasing magnetic field on the side of the magnetoresistive film where a signal flux is introduced. If the condition is satisfied, it is possible to attain an increased output and Barkhausen noise control, at the same time. In this case, it is preferable that the sense current magnetic field can compete with the biasing magnetic field strength, but an excessively high sense current brings about a problem of heat generation in the device. From these viewpoints, it is more preferable to set the sense current I to the range of 3 mA≦I≦15 mA.

Further, it has been found a phenomenon that, in a current perpendicular to plane type magnetoresistive device, an effective track width changes with a sense current value. In particular, this tendency becomes significant when a space between the biasing films on the both sides of the magnetoresistive film is made large to set apart the electrode and the biasing film. Therefore, in order to attain an effective track width as it is designed, it is preferable to consider not only the electrode width but also setting of the sense current value during operation.

In this case too, it is preferable to the relationship of 0<I<20 mA is met, supposing that the direction of the current is defined as the plus direction in the case where the current is flowed so that a magnetic field is generated that is substantially anti-parallel to the direction of the biasing magnetic field on the side of the magnetoresistive film where a signal flux is introduced. If the condition is met, it is possible to restrict increase in an effective track width effectively. Also, if an electrode with a width narrower than the effective track width to be designed and the sense current value is set to the above range, it is possible to obtain a desired effective track width. In this case too, it is preferable that the sense current magnetic field is high, but an excessively high sense current brings about a problem of heat generation in the device, and therefore it is more preferable to set the sense current I to the range of 3 mA≦I≦15 mA.

In a current perpendicular to plane type magnetoresistive device according to another embodiment, the magnetoresistive film may be formed in such a manner that the width on the air-bearing surface side facing to a signal flux is larger than the depth from the air-bearing surface facing to the signal flux. In this case, a shape anisotropic magnetic field is imparted to the magnetoresistive film, which makes magnetization of the magnetoresistive film stable in a longitudinal direction. Since the sense current magnetic field, biasing magnetic field and shape anisotropic magnetic field are applied to the magnetoresistive film, permeability of the magnetoresistive film can be improved, which makes it possible to provide an optimum operational point stably, as well as a single domain can be easily attained in the magnetoresistive film, which makes it possible to improve sensitivity.

In a current perpendicular to plane type magnetoresistive device according to still another embodiment, the electrode may be formed in such a manner that the width on the air-bearing surface side facing to a signal flux is larger than the depth from the air-bearing surface facing to the signal flux. In this case, the sense current magnetic field is made close to linear, and the above effects can be attained easily.

The above current perpendicular to plane type magnetoresistive device may be applied to a shield type head by combining with a pair of magnetic shields formed so as to sandwich the device. In this case, a flux guide is arranged on the air-bearing surface side of the magnetoresistive film so that the flux guide only is arranged between shields on the air-bearing surface, and a sense current is flowed through the magnetoresistive film in a direction perpendicular to the plane in such a manner that the direction of the magnetic field generated by the sense current is made substantially anti-parallel to the direction of the biasing magnetic field on the air-bearing surface side.

The current perpendicular to plane type magnetoresistive device mentioned above may be applied to a yoke type head by combining with a magnetic yoke to which a signal flux is introduced. For example, in the case of horizontal yoke type, the electrode is arranged on an area corresponding to a substantially non-sensitive area such as on the yoke with displaced from a portion just above the gap, and a sense current is flowed through the magnetoresistive film in a direction perpendicular to the plane in such a manner that the direction of the magnetic field generated by the sense current is made substantially anti-parallel to the direction of the biasing magnetic field in a portion of the magnetoresistive film just above the gap where highest sensitivity is attained.

In a current perpendicular to plane type magnetoresistive device according to further another embodiment, there is provided a magnetic recording/reproducing apparatus including a magnetic recording medium and a magnetic head as mentioned above. When recorded data are reproduced by use of the magnetic recording/reproducing apparatus, a sense current is flowed through the magnetoresistive film in a direction perpendicular to the plane in such a manner that the direction of the magnetic field generated by the sense current is made substantially anti-parallel to the direction of the biasing magnetic field on a side where a signal flux from the medium is introduced.

Embodiments of the present invention will be described in more details hereinafter with referring to the drawings.

Figure 3:
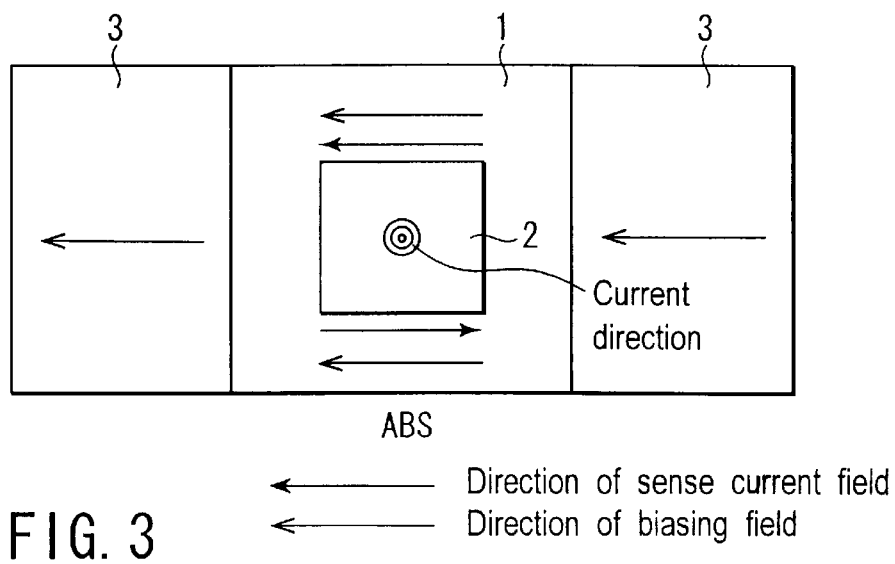
FIG. 3 is a plan view showing a magnetoresistive device according to an embodiment.

FIG. 3 is a plan view showing a magnetoresistive device according to an embodiment of the invention. In FIG. 3, the bottom side is corresponding to the air-bearing surface. As a magnetoresistive film 1, a tunneling magnetoresistive film (TMR film) or a CPP-GMR film is used, and films are laminated at right angle to the surface of the paper sheet. Electrodes 2 made of Cu are formed above and below the magnetoresistive film 1. Biasing films 3, 3 made of CoPt are arranged on both sides of the magnetoresistive film 1.

Figure 4:
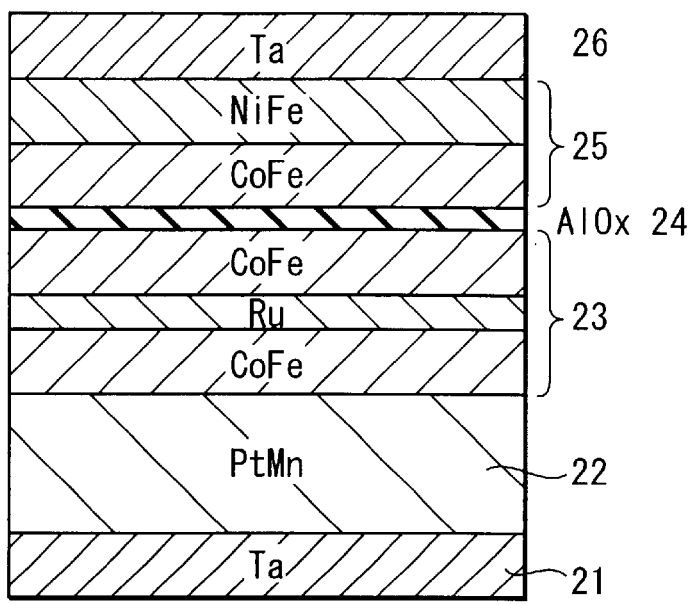
FIG. 4 is a cross sectional view showing a magnetoresistive film including a TMR film.

FIG. 4 shows an example of a TMR film. The TMR film in FIG. 4 has a structure that an underlayer 21 made of Ta, an antiferromagnetic layer 22 made of PtMn, a magnetization fixed layer (pinned layer) 23 formed of a three-layered film of CoFe/Ru/CoFe, a tunnel junction layer 24 made of AlOx, a magnetization free layer (free layer) 25 formed of a two-layered film of CoFe/NiFe, and a protective layer 26 made of Ta are laminated.

Figure 5:
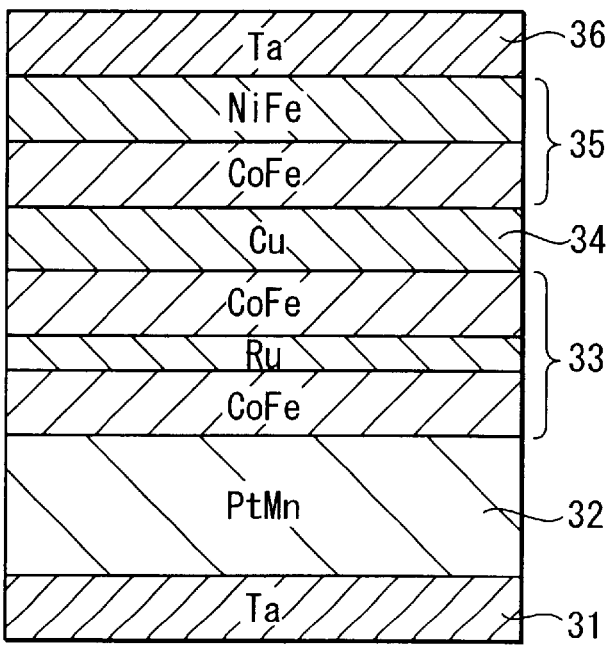
FIG. 5 is a cross sectional view showing a magnetoresistive film including a CPP-GMR film.

FIG. 5 shows an example of a CPP-GMR film. The CPP-GMR film in FIG. 5 has a structure that an underlayer 31 made of Ta, an antiferromagnetic layer 32 made of PtMn, a magnetization fixed layer (pinned layer) 33 formed of a three-layered film of CoFe/Ru/CoFe, a nonmagnetic intermediate layer (spacer layer) 34 made of Cu, a magnetization free layer (free layer) 35 formed of a two-layered film of CoFe/NiFe, and a protective layer 36 made of Ta are laminated. A single layer of CoFe and the like may be used for the pinned layer 33 and the free layer 35.

The order of lamination of respective layers in the TMR film or CPP-GMR film may be in the reverse order to those shown in FIG. 4 or FIG. 5. The TMR film or CPP-GMR film may be a dual-type in which two pinned layers are arranged symmetrically with the free layer as the center.

Arrangement of the magnetoresistive film and the biasing films is not limited, if the biasing films can apply a biasing magnetic field to the magnetoresistive film in a direction substantially parallel to the plane. With reference to FIG. 6 through FIG. 9, the manner of arrangement of the magnetoresistive film and the biasing films will be explained hereinafter.

Figure 6:
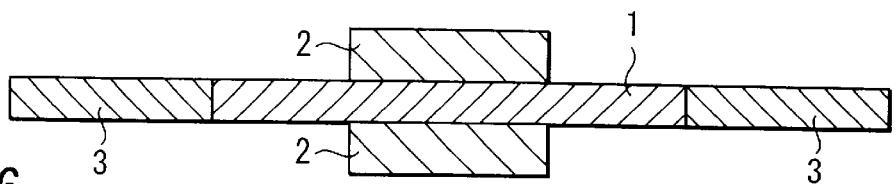
FIG. 6 is a cross sectional view showing a magnetoresistive device according to an embodiment.
Figure 7:
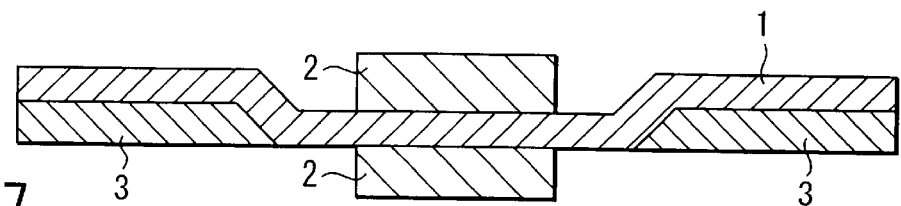
FIG. 7 is a cross sectional view showing a magnetoresistive device according to another embodiment.
Figure 8:
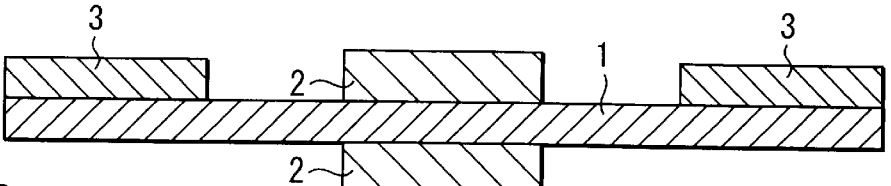
FIG. 8 is a cross sectional view showing a magnetoresistive device according to another embodiment.
Figure 9:
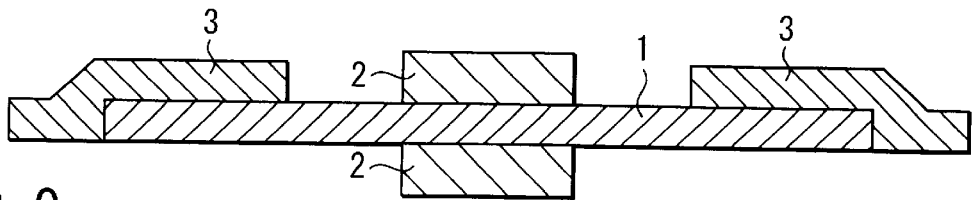
FIG. 9 is a cross sectional view showing a magnetoresistive device according to another embodiment.

FIG. 6 is a cross sectional view showing the magnetoresistive device shown in FIG. 3. As shown in this figure, the biasing films 3, 3 are arranged adjacent to both ends of the magnetoresistive film 1. FIG. 7 shows a magnetoresistive device in which the magnetoresistive film 1 is laminated on the biasing films 3, 3. FIG. 8 shows a magnetoresistive device in which the biasing films 3, 3 are laminated on the magnetoresistive film 1. FIG. 9 shows a magnetoresistive device in which a part of the biasing films 3, 3 are overlapped on the magnetoresistive film 1.

When a hard magnetic material such as CoPt is used for the biasing films 3, 3, the structure shown in FIG. 6 or FIG. 7 is preferred. While, when an antiferromagnetic material such as PtMn is used for the biasing films 3, 3, the structure shown in FIG. 7 or FIG. 8 is preferred.

As shown in FIG. 3, the magnetization direction of the biasing films 3, 3 made of CoPt is set in the left-hand direction. A sense current is flowed through the magnetoresistive film 1 in a perpendicular direction to the plane, from the upper to the lower with respect to the surface of the paper sheet, and a sense current magnetic field is generated in the direction represented by the arrow line in the figure around the electrode 2. As a result, the direction of the magnetic field of the biasing film 3 and the direction of the magnetic field generated by the current flowing through the magnetoresistive film 1 in the perpendicular direction to the plane is made substantially anti-parallel with each other on the air-bearing surface side where a signal flux is introduced from the medium. In this way, since the biasing magnetic field and the sense current magnetic field work to compensate with each other on the air-bearing surface side, it is possible to restrict lowering in permeability on the side of the magnetoresistive film 1 where a signal flux is introduced into the sensing area. Also, since the medium flux is introduced into the magnetoresistive film just below the electrode that functions as a sensing area without being disturbed by the sense current magnetic field, sensitivity can be maintained. On the other hand, on the opposite side of the air-bearing surface, since both magnetic fields are superimposed to each other, a strong biasing magnetic field is applied, bringing about lowering in permeability in the portion. However, since this portion is not the sensing area and also does not contribute to introduce the medium flux, there arises no problem.

Figure 10:
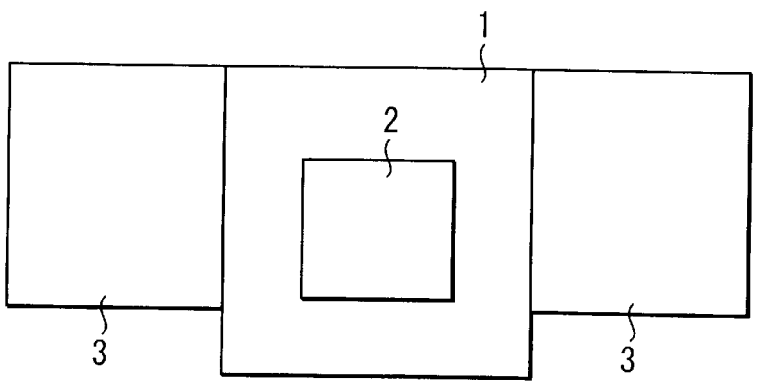
FIG. 10 is a plan view showing a magnetoresistive device according to another embodiment.

FIG. 10 is a plan view showing a magnetoresistive device according to another embodiment. The device in FIG. 10 has a structure similar to that shown in FIG. 3 except that the biasing films 3 are recessed from the air-bearing surface of the magnetoresistive film 1. In this structure, when a magnetic field from the biasing film is strong in such a case where, for example, the space between the biasing films is narrow, it is possible to apply an appropriate magnitude of magnetic field to the air-bearing surface side of the magnetoresistive film 1.

Figure 11:
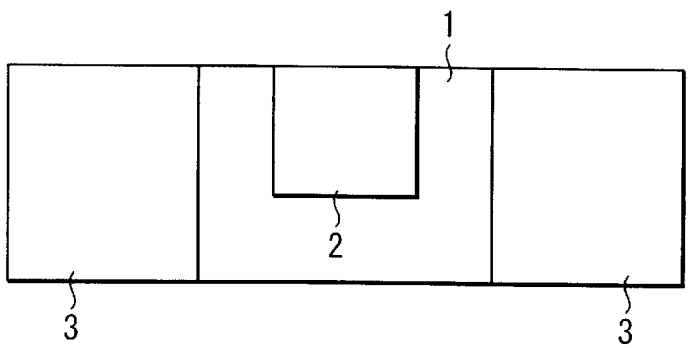
FIG. 11 is a plan view showing a magnetoresistive device according to another embodiment.
Figure 12:
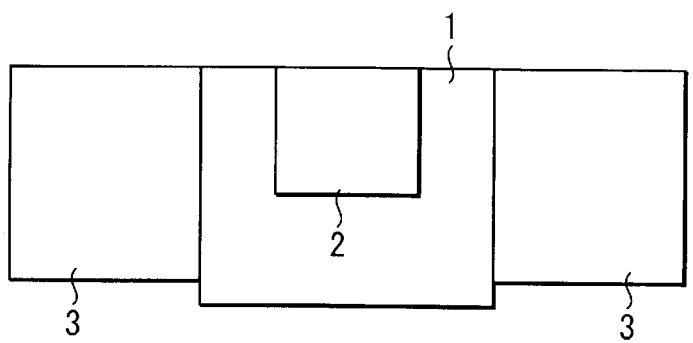
FIG. 12 is a plan view showing a magnetoresistive device according to another embodiment.

FIG. 11 and FIG. 12 are plan views showing magnetoresistive devices according to still another embodiments of the invention, respectively. The device in FIG. 11 has a structure similar to that shown in FIG. 3 except that the portion of the magnetoresistive film 1 that is not overlapped with the electrode 2 on the opposite side of the air-bearing surface is eliminated. While, the device in FIG. 12 has a structure similar to that shown in FIG. 10 except that that the portion of the magnetoresistive film 1 that is not overlapped with the electrode 2 on the opposite side of the air-bearing surface is eliminated. In the device in FIG. 11 or FIG. 12, since the portion on the opposite side of the air-bearing surface is eliminated where the biasing magnetic field and sense current magnetic field are superimposed and permeability is lowered and magnetization is made hard to rotate, it is possible to prevent magnetization in other portions from being made hard to rotate under the influence of the portion, which makes it possible to prevent sensitivity from lowering as a whole.

Figure 13:
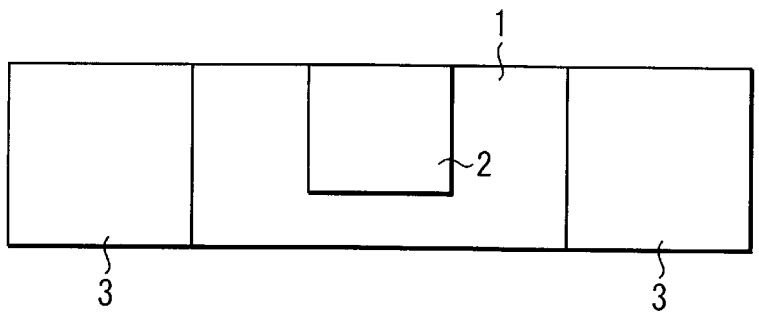
FIG. 13 is a plan view showing a magnetoresistive device according to another embodiment.

FIG. 13 is a plan view showing a magnetoresistive device according to further another embodiment of the invention. The device in FIG. 13 has a structure similar to that in FIG. 11 except that the width of the magnetoresistive film 1 along the air-bearing surface is larger than the depth from the air-bearing surface; in other words, the magnetoresistive film 1 has an oblong shape along the air-bearing surface. In this case, since shape anisotropy is imparted to the magnetoresistive film 1 in the longitudinal direction, and the anisotropic magnetic field is added to the biasing magnetic field from the biasing films 3, 3, it is possible to form a single domain easily in the magnetoresistive film 1.

Figure 14:
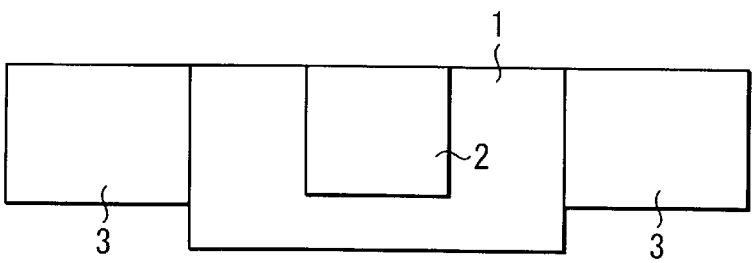
FIG. 14 is a plan view showing a magnetoresistive device according to another embodiment.
Figure 15:
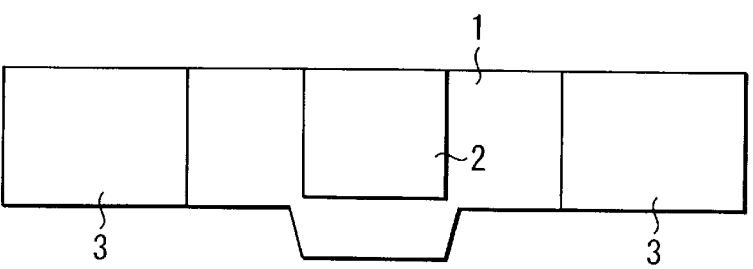
FIG. 15 is a plan view showing a magnetoresistive device according to another embodiment.

FIG. 14 and FIG. 15 are plan views showing magnetoresistive devices according to another embodiments of the invention, respectively. The device in FIG. 14 has a structure similar to that shown in FIG. 13 except that the biasing film 3 is recessed from the air-bearing surface of the magnetoresistive film 1. The device in FIG. 15 has a structure similar to that shown in FIG. 14 except that the width of protrusion of the magnetoresistive film 1 on the air-bearing surface side is made almost same as the width of the electrode 2. In these structures, the biasing magnetic field and shape anisotropic magnetic field are applied to the magnetoresistive film so as to make a single domain easily in the magnetoresistive film. Furthermore, when the magnetic field from the biasing films is strong in such a case where, for example, the space between the biasing films is narrow, it is possible to apply an appropriate magnitude of magnetic field to the portion of the magnetoresistive film 1 on the air-bearing surface side.

Figure 16:
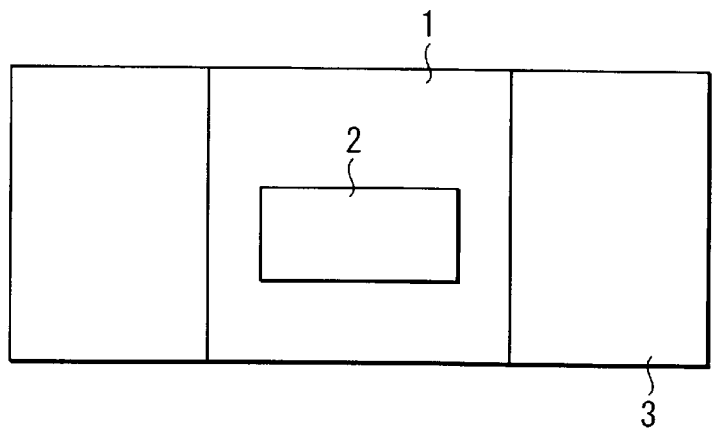
FIG. 16 is a plan view showing a magnetoresistive device according to another embodiment.

FIG. 16 is a plan view showing a magnetoresistive device according to yet another embodiment of the invention. The device in FIG. 16 has a structure similar to that in FIG. 3 except that the width of the electrode 2 along the air-bearing surface is larger than the depth viewed from the air-bearing surface; in other words, the electrode 2 has an oblong shape along the air-bearing surface. In this structure, since linearity of a sense current magnetic field is improved on the air-bearing surface side, the effect of compensation of the biasing magnetic field with the sense current magnetic field is enhanced. Therefore, bias control in the magnetoresistive film 1 on the air-bearing surface side becomes easier.

Figure 17:
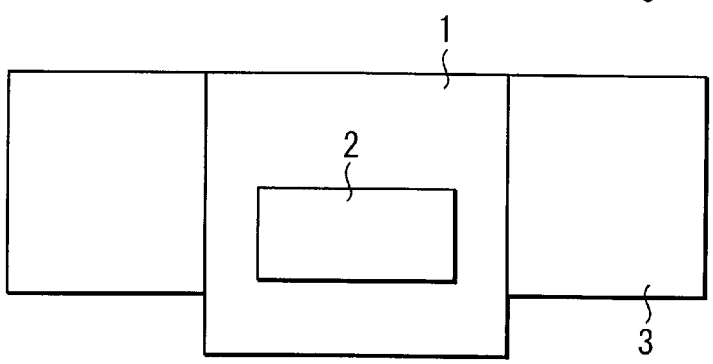
FIG. 17 is a plan view showing a magnetoresistive device according to another embodiment.
Figure 18:
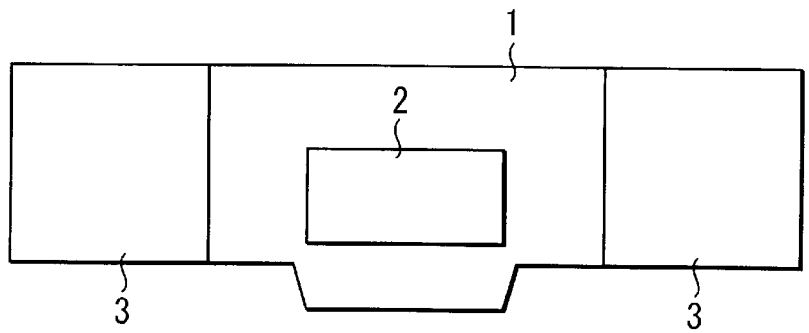
FIG. 18 is a plan view showing a magnetoresistive device according to another embodiment.

FIG. 17 and FIG. 18 are plan views showing magnetoresistive devices according to another embodiments of the invention, respectively. The device in FIG. 17 has a structure similar to that shown in FIG. 16 except that the biasing films 3 are recessed from the air-bearing surface of the magnetoresistive film 1. The device in FIG. 18 has a structure similar to that shown in FIG. 17 except that the width of the protrusion of the magnetoresistive film 1 on the air-bearing surface side is made almost same as the width of the electrode 2. In these structures, since linearity of a sense current magnetic field is improved on the air-bearing surface side, the effect of compensation of the biasing magnetic field with the sense current magnetic field is enhanced. Furthermore, when the magnetic field from the biasing films is strong in such a case where, for example, the space between the biasing films is narrow, it is possible to apply an appropriate magnitude of magnetic field to the portion of the magnetoresistive film 1 on the air-bearing surface side. Therefore, bias control in the magnetoresistive film 1 on the air-bearing surface side becomes easier. Further, as shown in FIG. 18, when the width of the protrusion of the magnetoresistive film 1 on the air-bearing surface side is made almost same as the width of the electrode 2, it is possible to impart longitudinal shape anisotropy to the magnetoresistive film 1. Accordingly, it is possible to add the shape anisotropic magnetic field to the biasing magnetic field, which makes it possible to make a single domain more easily in the magnetoresistive film.

Among structures of magnetoresistive devices shown in FIG. 3 and FIG. 10 through FIG. 18, those devices are preferred having a structure that the end of the magnetoresistive film 1 on the air-bearing surface side and the end of the biasing film 3 at the air-bearing surface side are made in the same plane as shown in FIGS. 3, 11, 13 and 16. In this case, the biasing magnetic field is made stable in the portion of the magnetoresistive film 1 on the air-bearing surface side, and further an effect is provided that manufacturing processes are made simple because there needs no step to form an additional layer.

Figure 19:
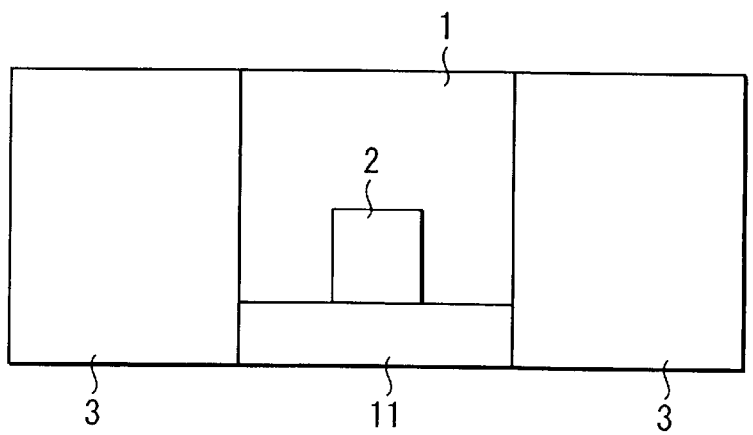
FIG. 19 is a plan view showing a magnetoresistive device according to another embodiment.

In FIGS. 3, 11, 13 and 16, a part of the magnetoresistive film 1 is used as the flux guide, and the thickness of the flux guide portion is same as the thickness of other portions of the magnetoresistive film 1. On the other hand, as shown in FIG. 19, a soft magnetic layer 11 made of, for example, NiFe or the like may be formed between the magnetoresistive film 1 and the air-bearing surface to form the flux guide, and the end of the soft magnetic layer 11 on the air-bearing surface side and the end of the biasing film 3 on the air-bearing surface side may be made in the same plane. Note that, the flux guide shown in FIG. 19 can be formed by extending only the free layer of the magnetoresistive film 1 toward the air-bearing surface side. In this case too, a biasing magnetic field in the magnetoresistive film 1 is made stable on the air-bearing surface side, and manufacturing processes may be made simple. When the flux guide is formed of a magnetic layer separately arranged from the magnetoresistive film 1 or a part of the free layer of the magnetoresistive film 1, it is possible to make the flux guide thinner, which is advantageous for a narrow gap.

Figure 20:
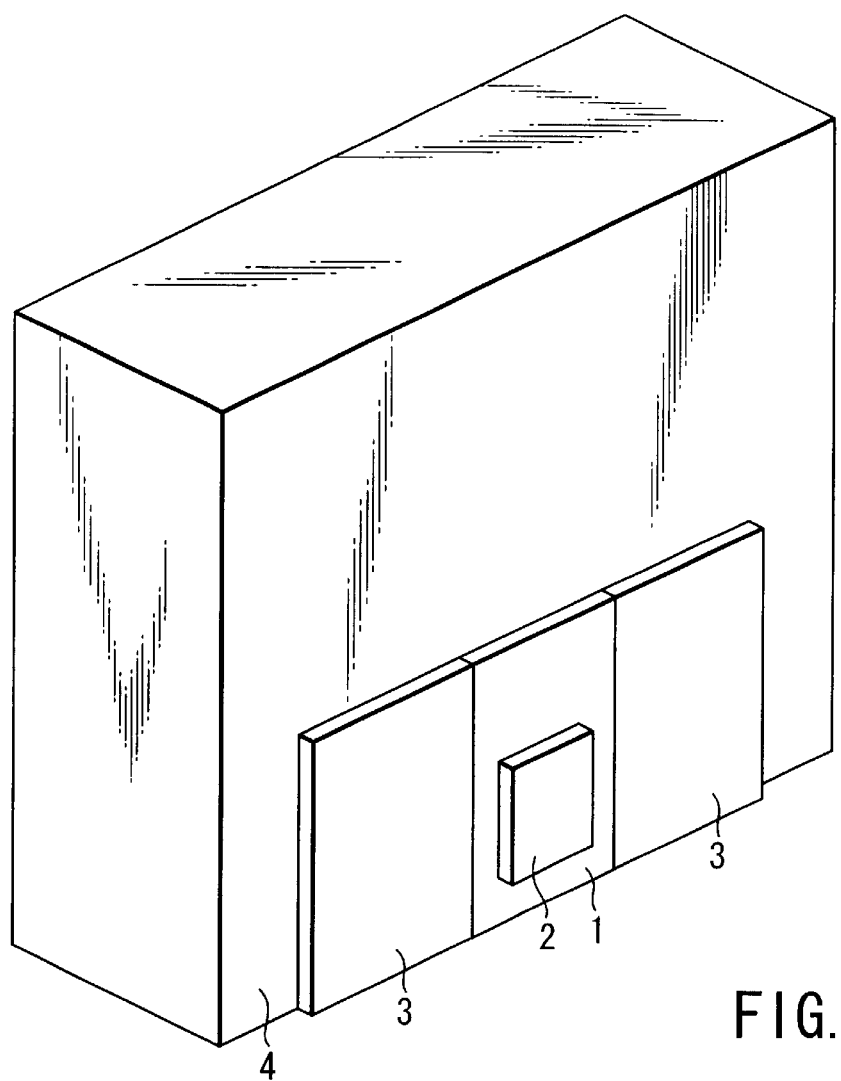
FIG. 20 is a perspective view showing a shield type head according to an embodiment.

FIG. 20 is a perspective view showing a shield type head according to an embodiment of the invention. In this figure, the bottom side is corresponding to the air-bearing surface side. The electrodes 2 made of Cu are formed above and below the magnetoresistive film 1. The biasing films 3, 3 made of CoPt are arranged on both sides of the magnetoresistive film 1. The magnetoresistive device has a structure similar to that shown in FIG. 3. Further, magnetic shields 4 made of NiFe are arranged in contact with the electrodes 2. Note that, a magnetic shield on one side is not illustrated in this figure.

Figure 21:
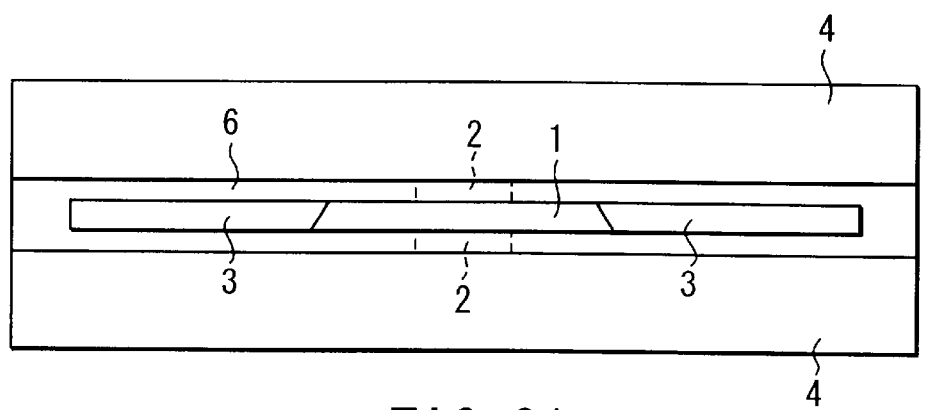
FIG. 21 is a plan view showing the shield type head of FIG. 20 viewed from the air-bearing surface.

FIG. 21 is a plan view showing a shield type head of FIG. 20 viewed from the air-bearing surface. The electrodes 2, 2 are arranged above and below the magnetoresistive film 1. The biasing films 3, 3 are arranged on both sides of the magnetoresistive film 1. These members are sandwiched by a pair of shields 4, 4 with insulated with an insulation film 6 made of $Al_2O_3$ or so. In the present embodiment, the magnetic shields 4 are formed so as to function as current leads.

In this shield type magnetic head, the direction of a sense current is determined so that the magnetic field of the biasing film 3 made of CoPt is compensated with the sense current magnetic field on the air-bearing surface side. As a consequence, the medium flux is introduced into the magnetoresistive film 1 just below the electrode 2, which functions as a sensing area, without being disturbed by the sense current magnetic field, so that it is possible to maintain sensitivity of the shield type magnetic head.

In FIG. 3, and FIG. 10 through FIG. 18, described are examples in which the end of the electrode 2 on the air-bearing surface side is recessed from the end of the magnetoresistive film 1 on the air-bearing surface side. However, it theoretically suffices if the direction of the biasing magnetic field and the direction of the sense current magnetic field are in substantially anti-parallel with each other in the portion of the magnetoresistive film on the side where a signal flux is introduced. Accordingly, the present invention is not limited to the above examples, and includes such a structure that the end of the electrode 2 on the air-bearing surface side is made in the same plane with the end of the magnetoresistive film 1 or the end of the electrode 2 is located by a medium relative to the end of the magnetoresistive film 1.

Figure 23:
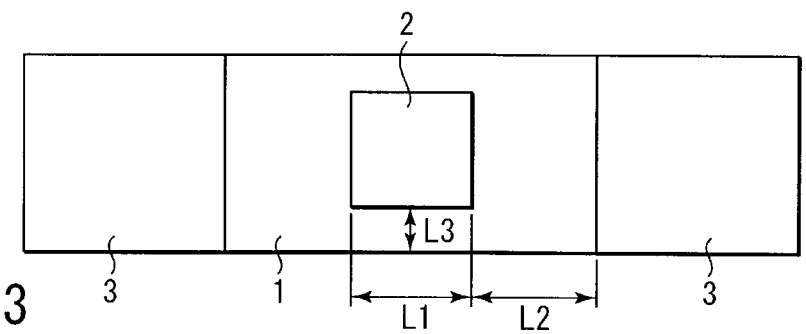
FIG. 23 is a plan view showing a CPP-GMR device to be employed in the shield type head of FIG. 22.
Figure 24:
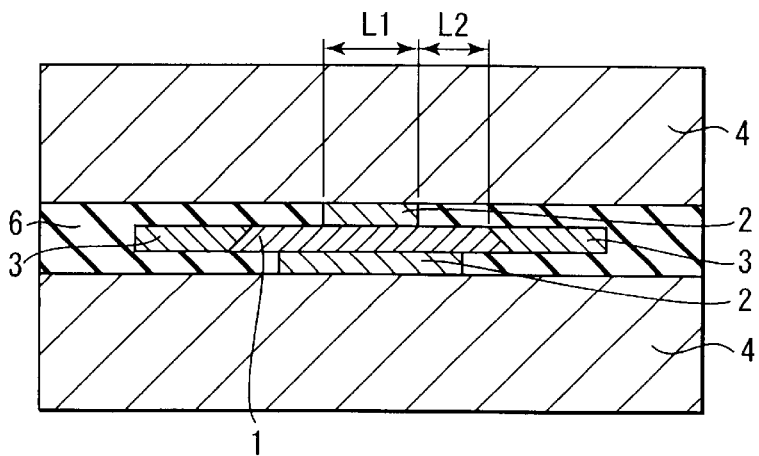
FIG. 24 is a cross sectional view showing the shield type head of FIG. 22.

Next, with referring to FIG. 22 through FIG. 24, the relationship among a width L1 of a contact area between the magnetoresistive film and the electrode in a track width direction, a distance L2 between an end of the electrode and an end of the biasing film facing to each other, and a distance L3 between an end of the magnetic film on the air-bearing surface and an end of the electrode substantially parallel therewith will be described for a shield type magnetic head according to the another embodiment.

Figure 22:
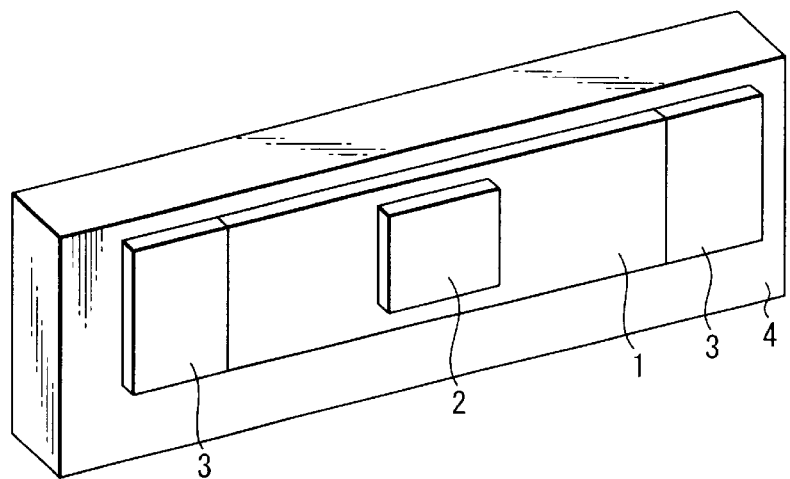
FIG. 22 is a perspective view showing a shield type head according to another embodiment.

FIG. 22 is a perspective view schematically showing principal part of a shield type head provided with a current perpendicular to plane type magnetoresistive device according to the present embodiment. In FIG. 22, the upper side is corresponding to the air-bearing surface facing to the recording medium (not shown). FIG. 23 is a plan view showing the magnetoresistive device according to the present embodiment. In FIG. 23, the bottom side is corresponding to the air-bearing surface. FIG. 24 is a cross sectional view showing the shield type head according to the present embodiment. In FIG. 24, the near side is corresponding to the air-bearing surface.

As shown in these figures, the electrodes 2, 2 are arranged above and below the magnetoresistive film 1. The biasing films 3, 3 are arranged on both sides of the magnetoresistive film 1. These members are sandwiched by a pair of shields 4, 4 with insulated with the insulation film 6 made of $Al_2O_3$ or the like. In the present embodiment, the magnetic shields 4 are formed so as to function as current leads. The magnetoresistive film 1 has a structure similar to that shown in, for example, FIG. 5, and similar materials as those described with reference to FIG. 5 are employed.

In the current perpendicular to plane type magnetoresistive device according to the present embodiment, the width L1 of the upper electrode 2 having the narrower width of a pair of electrodes (more strictly, the width of the contact area of the upper electrode 2 with the magnetoresistive film 1 along the track width direction, namely along the arrangement direction of the biasing films 3, 3) and the distance L2 between the upper electrode 2 and the biasing film 3 satisfy the following relationship (1), and the distance L3 of the magnetoresistive film portion from the end of the air-bearing surface side of the upper electrode 2 to the air-bearing surface satisfies the following relationship (2):

$$L1 \times 0.2 < L2 < L1 \times 2 \quad (1)$$

$$0 < L3 < 0.1\ \mu m \quad (2)$$

If the above relation (1) is satisfied, it is possible to increase sensitivity and at the same time to restrict increase in an effective track width. Namely, when the biasing films 3 are arranged on both sides of the magnetoresistive film 1, a strong biasing magnetic field is applied to the portion of the magnetoresistive film 1 near the biasing film 3, but a weaker biasing magnetic filed is applied to the central portion of the magnetoresistive film 1 away from the biasing film 3. Since the electrodes 2, 2 arranged above and below the magnetoresistive film 1 form a pillar shape and a sense current is not supplied to the portion of the magnetoresistive film 1 near the biasing film 3, this portion does not become a sensing area. However, since a sense current is selectively supplied to the central portion of the magnetoresistive film 1, the portion functions as a sensing area and can realize high sensitivity. In this case, the electrode width L1 and the distance L2 between the electrode and the biasing film satisfy the above relationship, an appropriate biasing magnetic field is applied to the sensing area, so that high sensitivity can be obtained. Since L2 is not zero, a medium flux intruding into the magnetoresistive film on both sides of the electrode acts to increase an effective track width. However, if the condition of L2<L1×2 is met, magnetization in the GMR film in the vicinity of the biasing film is hard to rotate, so that the amount of medium flux intruding into the magnetoresistive film on both sides of the electrode is decreased. And therefore, it is possible to restrict increase in the effective track width.

If the above condition (2) is satisfied, since the electrode is recessed from the air-bearing surface and is not exposed to the air-bearing surface, it is possible to restrict thermal asperity noise arising from contact between the head and the medium in operation. This is especially effective when the flying height of the head is low. However, when L3 is made too large, a sensing area is located remotely from the air-bearing surface. Accordingly, not only sensitivity is deteriorated, but also the amount of the medium flux intruding into the magnetoresistive film on both sides of the electrode is increased, leading to increase in the effective track width. Therefore, it is preferable to set L3 to 0.1 μm or less.

In this structure, since there is no electrode on the air-bearing surface, it is possible to realize a narrow shield-to-shield distance (narrow gap), and it is possible to make shield-to-shield distance wide enough so as to contain the structure of electrode/magnetoresistive film/electrode on the remote side, so that a high recording density can be realized.

Next, the fact that an effective track width can be adjusted by a sense current will be described. The polarity of the current is defined as the plus direction in the case where the current is flowed so that a magnetic field is generated that is substantially anti-parallel to the direction of the biasing magnetic field on the side of the magnetoresistive film as shown in FIG. 3.

Figure 25:
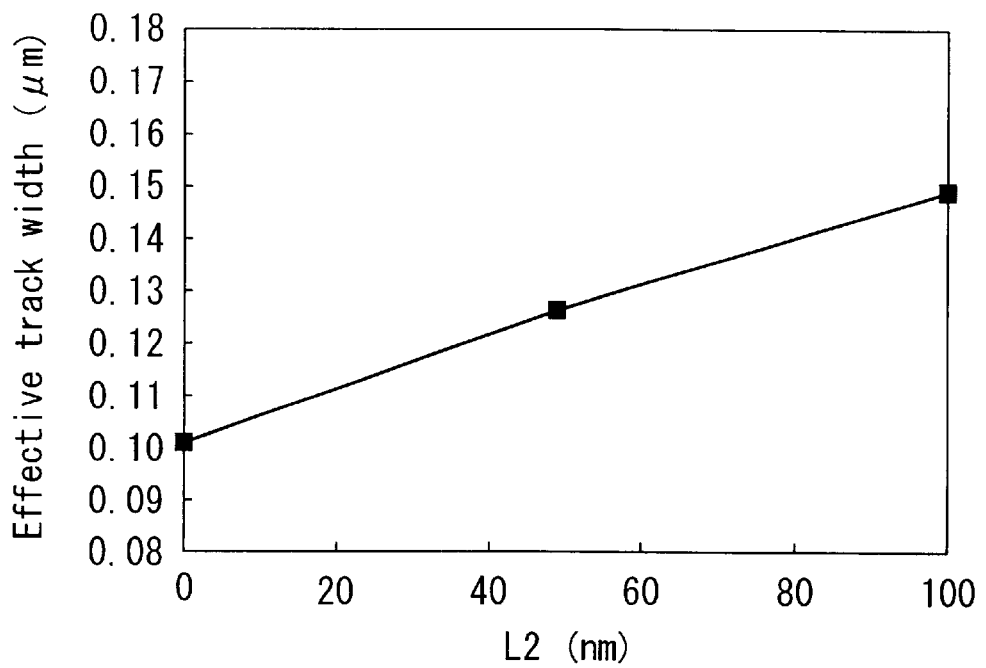
FIG. 25 is a diagram showing a relationship between a distance L2 between an electrode and a biasing film, and an effective track width.

FIG. 25 shows the results of calculation for the effective track width by micro magnetic simulation where the electrode width (physical track width) L1 is set to 100 nm (0.1 μm), the sense current value is set to −5 mA, and the distance L2 between the electrode and the biasing film is changed. From this figure, it is found that the effective track width becomes wider than electrode width L1 with increase in L2.

Figure 26:
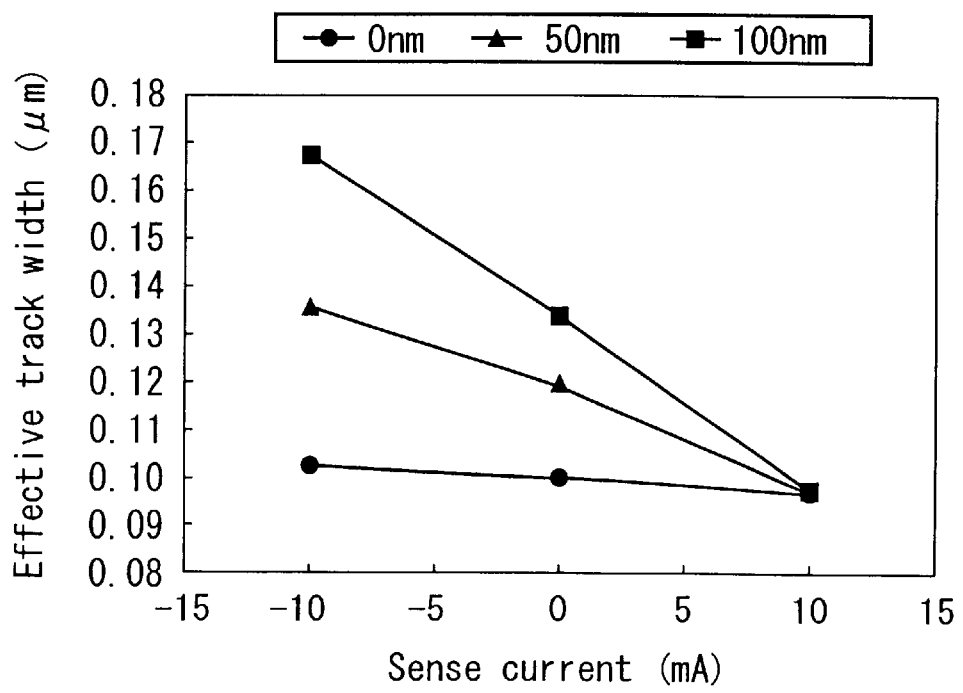
FIG. 26 is a diagram showing a relationship between a sense current and an effective track width.

For more detailed examination, further calculations are conducted to obtain sense current dependency of the effective track width. In this case, the distance L2 between the electrode and the biasing film is set to 0 nm, 50 nm, or 100 nm. The results are shown in FIG. 26. As shown in FIG. 26, it is known that the larger L2, the higher the change rate of the effective track width to sense current. This means that in order to attain a desired effective track width in the structure described in the present embodiment, it is preferable to determine in advance not merely L1, L2, and L3, but also the sense current value. For example, in order to obtain the effective track width of 0.11 μm with the physical track width L1 of 0.1 μm, it is preferable to set the sense current value to about 5 mA when L2 is 50 nm, while it is preferable to set the sense current to about 7 mA when L2 is 100 nm.

In order to obtain a desired output value in the magnetoresistive device according to the present embodiment, only the absolute value of the sense current is concerned irrespective of the polarity of sense current, i.e., whether it is positive or negative. However, when a device is designed so as to supply a sense current having a minus polarity, the effective track width significantly increases relative to the physical track width L1, and therefore it is necessary to form the physical track width L1 rather small in comparison with a predetermined effective track width. This is not preferred because difficulty arises in manufacturing processes. On the contrary, when a device is designed so as to supply a sense current having a plus polarity, an advantageous effect is obtained that the difference between the physical track width and the effective track width becomes small. On the other hand, although a sense current of a high absolute value is preferred in order to obtain high output, an excessively high sense current leads to deteriorated characteristics owing to heat generation. From these viewpoints, it is preferable to set the magnitude of sense current I to the range of 0<I<20 mA, more preferably to the rage of $3 \leq I \leq 15$ mA.

Figure 27:
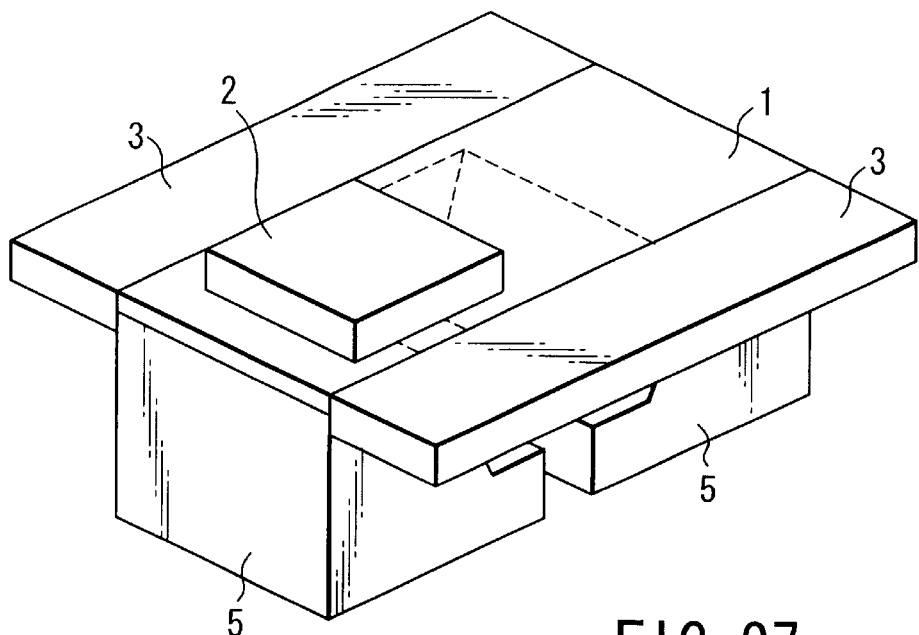
FIG. 27 is a perspective view showing a horizontal yoke type head according to an embodiment.

FIG. 27 is a perspective view showing a horizontal yoke type head according to an embodiment of the invention. In this figure, the bottom side is corresponding to the air-bearing surface. The electrodes 2 made of Cu are formed on the magnetoresistive film 1. The biasing films 3, 3 made of CoPt are arranged on both sides of the magnetoresistive film 1. Further, the magnetic yoke 5 made of NiFe that defines the magnetic gap is formed below the magnetoresistive film 1. The electrodes 2 are displaced from the portion just above the gap of the magnetic yoke 5, and the magnetoresistive film 1 is located just above the gap of the magnetic yoke 5. The magnetic yoke 5 positioned below the electrode 2 functions as the other electrode.

In this horizontal yoke type magnetic head, the direction of the sense current is determined so that the magnetization direction of the biasing film 3 made of CoPt and the sense current magnetic field are compensated with each other on the air-bearing surface side in the portion of the magnetoresistive film 1 located just above the gap of the magnetic yoke 5. Accordingly, a medium flux is introduced into the magnetoresistive film 1 functions as a sensing area without being disturbed by the sense current magnetic field, so that it is possible to maintain the sensitivity of the horizontal yoke type magnetic head.

Figure 28:
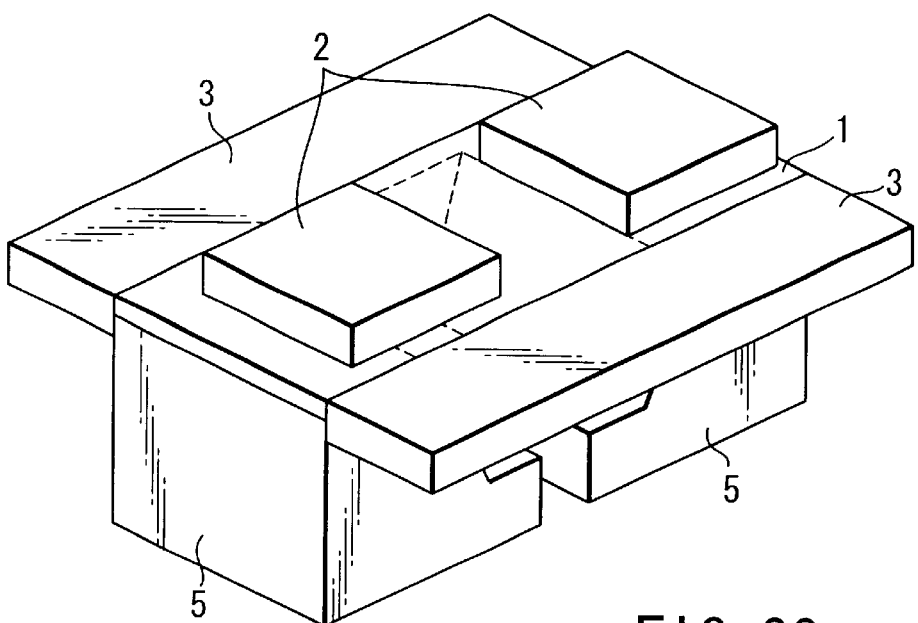
FIG. 28 is a perspective view showing a horizontal yoke type head according to another embodiment.

FIG. 28 is a perspective view showing a horizontal yoke type head according to another embodiment of the invention. This horizontal yoke type head in FIG. 28 has a structure similar to that in FIG. 27 except that two electrodes 2, 2 are formed on the positions displaced from the portion just above the magnetic gap of the magnetic yoke 5, symmetrically with respect to the gap. Although not illustrated, the tip end of the magnetic gap of the magnetic yoke 5 is filled with Cu that has higher conductivity than the magnetoresistive film. In this horizontal yoke type magnetic head, a sense current flows from one electrode 2 to the other electrode 2 through the magnetoresistive film 1, the magnetic yoke 5, the Cu in the magnetic gap portion, the magnetic yoke 5, and the magnetoresistive film 1.

In this horizontal yoke type magnetic head too, the direction of the sense current is determined so that the magnetization direction of the biasing film 3 made of CoPt and the sense current magnetic field are compensated with each other on the air-bearing surface side in the portion of the magnetoresistive film 1 located just above the gap of the magnetic yoke 5. Accordingly, a medium flux is introduced into the magnetoresistive film 1 functions as a sensing area without being disturbed by the sense current magnetic field, so that it is possible to maintain the sensitivity of the horizontal yoke type magnetic head.

Next, explanations will be made on a magnetic head assembly employing a magnetic head of the above embodiment, and a magnetic disk drive employing this magnetic head assembly. A magnetoresistive device or magnetic head may be mounted in a magnetic recording/reproducing apparatus as, for example, an integrated magnetic head assembly.

Figure 29:
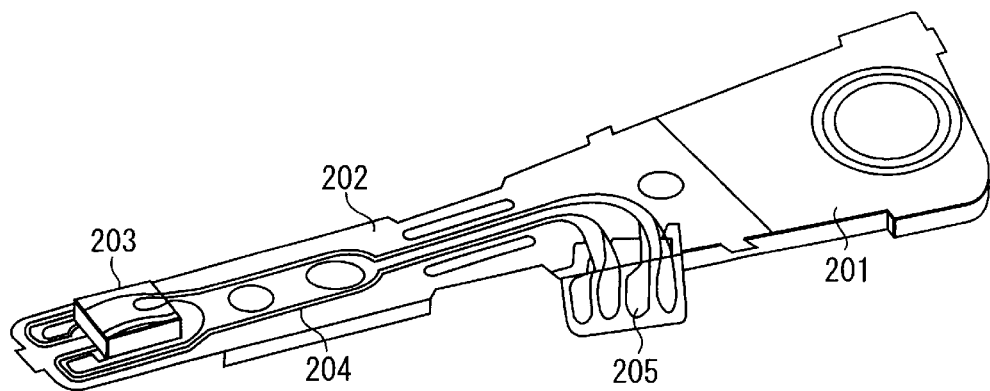
FIG. 29 is a perspective view showing a magnetic head assembly according to an embodiment.

FIG. 29 is a perspective view showing a recording and reproducing integrated type magnetic head assembly having a CPP-GMR device viewed from disk side. The actuator arm 201 with a hole to be fixed by a fixing shaft in the magnetic disk drive has a bobbin portion to hold a driving coil (not illustrated) and the like. The suspension 202 is fixed to one end of the actuator arm 201. The head slider 203 provided with a magnetic head having the CPP-GMR device according to any of the embodiments mentioned above is mounted on the end of the suspension 202. The lead wire 204 for writing and reading signals is formed on the suspension 202, one end of which lead wire 204 is connected to each electrode of the CPP-GMR device assembled in the head slider 203, and the other end of which lead wire 204 is connected to an electrode pad 205.

Figure 30:
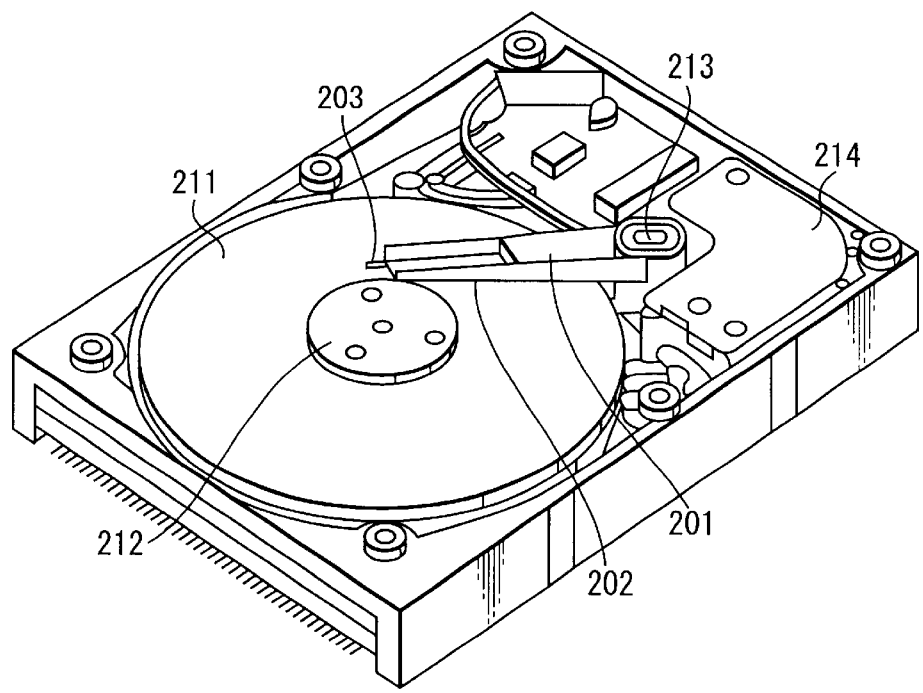
FIG. 30 is a perspective view showing the internal structure of a magnetic disk drive.

FIG. 30 is a perspective view showing the internal structure of a magnetic disk drive provided with the magnetic head assembly shown in FIG. 29. The actuator arm 201 is fixed to a fixing shaft 213, and supports a suspension 202 and a head slider 203 at the end thereof. The head slider 203 includes a magnetic head having the CPP-GMR device according to any of the embodiments mentioned above. When a magnetic disk 211 is rotated, the air-bearing surface of the head slider 203 is held lifted by a predetermined flying height from the surface of the magnetic disk 211, and recording/reproducing of information is performed. The head slider 203 may be contacted with the magnetic disk 211. The voice coil motor 214, one type of a linear motor is arranged on the proximal end of the actuator arm 201. The voice coil motor 214 comprises a driving coil (not illustrated) wound up to a bobbin portion of the actuator arm 201, and a magnetic circuit including a permanent magnet and a counter yoke arranged so as to sandwich the coil. The actuator arm 201 is held by ball bearings (not illustrated) and arranged at two portions, upper and lower, of the fixed shaft 213, and can rotate and slide freely by the voice coil motor 214.

The magnetic recording/reproducing apparatus according to the present embodiment, having the magnetic head including any of the CPP-GMR devices mentioned above, can precisely read information recorded in the magnetic disk at higher recording density than in the conventional one.

The magnetoresistive devices according to various embodiments of the present invention may be applied to a magnetic head or a magnetic recording/reproducing apparatus for perpendicular magnetic recording as well as for longitudinal magnetic recording, which can obtain the same effects as above. The magnetic recording/reproducing apparatus may be one having a fixed recording medium, or one using a removable recording medium.

The magnetoresistive devices according to various embodiments of the present invention may be applied to a magnetic random access memory (MRAM) in which information may be magnetically rewritable, which can obtain the same effects as above.

Besides the above, all the magnetoresistive devices, magnetic heads and magnetic recording/reproducing apparatuses that those skilled in the art may embody through appropriate design changes on the basis of the embodiments mentioned above are to be embraced in the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A current perpendicular to plane type magnetoresistive device comprising:

a magnetoresistive film;

a pair of electrodes which allow a sense current to flow through the magnetoresistive film in a perpendicular direction to a film plane; and a biasing film which imparts a biasing magnetic field to the magnetoresistive film in a parallel direction to the film plane;

wherein the direction of the magnetic field generated by the sense current flowing through the magnetoresistive film in the perpendicular direction to the film plane is made substantially anti-parallel to the direction of the biasing magnetic field in a vicinity of an air-bearing surface of the magnetoresistive film where a signal magnetic flux is introduced.

2. The device according to claim 1, wherein the magnetoresistive film has a structure that a nonmagnetic conductive layer is sandwiched between two ferromagnetic layers.

3. The device according to claim 1, wherein supposing that a width of a contact area between the magnetoresistive film and the electrode in a track width direction is L1, a distance between an end of the electrode and an end of the biasing film facing to each other is L2, and a distance between an end of the magnetic film on the air-bearing surface side and an end of the electrode substantially parallel therewith is L3, the following relationship is satisfied:

$$L1 \times 0.2 < L2 < L1 \times L2, \text{ and } 0 < L3 - 0.1\ \mu m.$$

4. The device according to claim 3, wherein the following relationship is satisfied:

$$L1 \times 0.5 L2 < L1 \times 1.$$

5. The device according to claim 1, wherein the electrode has a size of 0.3 $\mu m \times 0.3\ \mu m$ or less.

6. The device according to claim 1, wherein a value of the sense current I, which is flowed in a perpendicular direction to the plane of the magnetoresistive film so as to generate a magnetic field substantially anti-parallel to the direction of the biasing magnetic field on the side of the magnetoresistive film where the signal magnetic flux is introduced, is set to a range of 0 <I<20 mA.

7. The device according to claim 6, wherein an effective track width of the magnetoresistive film is adjusted by the sense current value.

8. A magnetic head comprising a current perpendicular to plane type magnetoresistive device according to claim 1.

9. A magnetic recording/reproducing apparatus comprising:

a magnetic recording medium; and a magnetic head according to claim 8.

10. A current perpendicular to plane type magnetoresistive device comprising:

a magnetoresistive film;

a pair of electrodes which allow a sense current to flow through the magnetoresistive film in a perpendicular direction to a film plane;

a biasing film which imparts a biasing magnetic field to the magnetoresistive film in a parallel direction to the film plane; and a magnetic film disposed in a vicinity of an air-bearing surface of the magnetoresistive film where a signal magnetic flux is introduced to the magnetic film;

wherein the direction of the magnetic field generated by the sense current flowing through the magnetoresistive film in the perpendicular direction to the film plane is made substantially anti-parallel to the direction of the biasing magnetic field in the magnetic film disposed in the vicinity of the air-bearing surface.

11. The device according to claim 10, wherein an end of the magnetoresistive film on the air-bearing surface side and an end of the biasing film on the air-bearing surface side are formed to be in the same plane.

12. The device according to claim 10, wherein an end of the magnetic film on the air-bearing surface side and an end of the biasing film on the air-bearing surface side are formed to be in the same plane.

13. The device according to claim 10, wherein the magnetoresistive film has a structure that a nonmagnetic conductive layer is sandwiched between two ferromagnetic layers.

14. The device according to claim 10, wherein supposing that a width of a contact area between the magnetoresistive film and the electrode in a track width direction is L1, a distance between an end of the electrode and an end of the biasing film facing to each other is L2, and a distance between an end of the magnetic film on the air-bearing surface side and an end of the electrode substantially parallel therewith is L3, the following relationship is satisfied:

$$L1 \times 0.2 < L2 < L1 \times L2, \text{ and } 0 < L3 - 0.1 \, \mu m.$$

15. The device according to claim 14, wherein the following relationship is satisfied:

$$L1 \times 0.5 < L2 < L1 \times 1.$$

16. The device according to claim 10, wherein the electrode has a size of 0.3 $\mu$m×0.3 $\mu$m or less.

17. The device according to claim 10, wherein a value of the sense current I, which is flowed in a perpendicular direction to the plane of the magnetoresistive film so as to generate a magnetic field substantially anti-parallel to the direction of the biasing magnetic field on the side of the magnetoresistive film where the signal magnetic flux is introduced, is set to a range of 0<I<20 mA.

18. The device according to claim 17, wherein an effective track width of the magnetoresistive film is adjusted by the sense current value.

19. A magnetic head comprising a current perpendicular to plane type magnetoresistive device according to claim 10.

20. A magnetic recording/reproducing apparatus comprising:

a magnetic recording medium; and a magnetic head according to claim 19.

* * * * *